(12) United States Patent
Tretbar et al.

(10) Patent No.: US 12,703,005 B2
(45) Date of Patent: Aug. 11, 2026

(54) SENSORS AND METHODS FOR GENERATING SPATIALLY ENCODED ACOUSTIC FIELDS BY SOUND-EMITTING APERTURES WITH SPATIALLY VARYING FREQUENCY AND BANDWIDTH

(71) Applicant: FRAUNHOFER-GESELLSCHAFT ZUR FÖRDERUNG DER ANGEWANDTEN FORSCHUNG E.V., Munich (DE)

(72) Inventors: Steffen Tretbar, St. Ingbert (DE); Marc Fournelle, Saarbrücken (DE); Daniel Schmitt, Ensdorf (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 1297 days.

(21) Appl. No.: 17/613,603

(22) PCT Filed: Feb. 12, 2020

(86) PCT No.: PCT/EP2020/053653

§ 371 (c)(1),
(2) Date: Apr. 28, 2022

(87) PCT Pub. No.: WO2020/233842

PCT Pub. Date: Nov. 26, 2020

(65) Prior Publication Data

US 2022/0250117 A1 Aug. 11, 2022

(30) Foreign Application Priority Data

May 23, 2019 (EP) .................................... 19176306

(51) Int. Cl.
*B06B 1/06* (2006.01)
*H10N 30/30* (2023.01)
*B06B 1/02* (2006.01)

(52) U.S. Cl.
CPC ......... *B06B 1/0644* (2013.01); *H10N 30/302* (2023.02); *B06B 1/0292* (2013.01)

(58) Field of Classification Search
CPC ........ B06B 1/06; B06B 1/0603; B06B 1/0292
(Continued)

(56) References Cited

U.S. PATENT DOCUMENTS 5,834,871 A 11/1998 Psukas
5,870,351 A 2/1999 Ladabaum
(Continued)

FOREIGN PATENT DOCUMENTS

WO WO 2017161384 A1 9/2017

OTHER PUBLICATIONS

Pieter Kruizinga, et al., "Compressive 3D ultrasound imaging using a single sensor," Science Advances, vol. 3, No. 12, pp. 1-11 (2017).

*Primary Examiner* — Derek J Rosenau
(74) *Attorney, Agent, or Firm* — Lippes Mathias LLP

(57) ABSTRACT

An acoustic transducer for generating and/or receiving a spatially structured acoustic field includes a total aperture which generates and/or receives the acoustic field. The total aperture includes a plurality of sub-apertures. Each of the sub-apertures is arranged to receive and/or generate ultrasound having a specific frequency spectrum. The specific frequency spectra of at least two of the sub-apertures differ. All sub-apertures of the total aperture are connected to a same electronic drive channel.

10 Claims, 12 Drawing Sheets

(58) Field of Classification Search
USPC .......................................... 310/322, 334, 335
See application file for complete search history.

(56) References Cited

U.S. PATENT DOCUMENTS

| | | | | |
|---|---|---|---|---|
| 2009/0020001 | A1 | 1/2009 | Oliver et al. | |
| 2013/0293065 | A1* | 11/2013 | Hajati | B06B 1/0629 310/334 |
| 2015/0105663 | A1* | 4/2015 | Kiyose | B06B 1/067 29/25.35 |
| 2017/0136495 | A1* | 5/2017 | Zhao | G01S 15/8915 |
| 2017/0217794 | A1 | 8/2017 | Lipkens et al. | |

* cited by examiner 20
22
24
22
28
26

38
32
39

30
36b
36a
34
32

Fig. 4
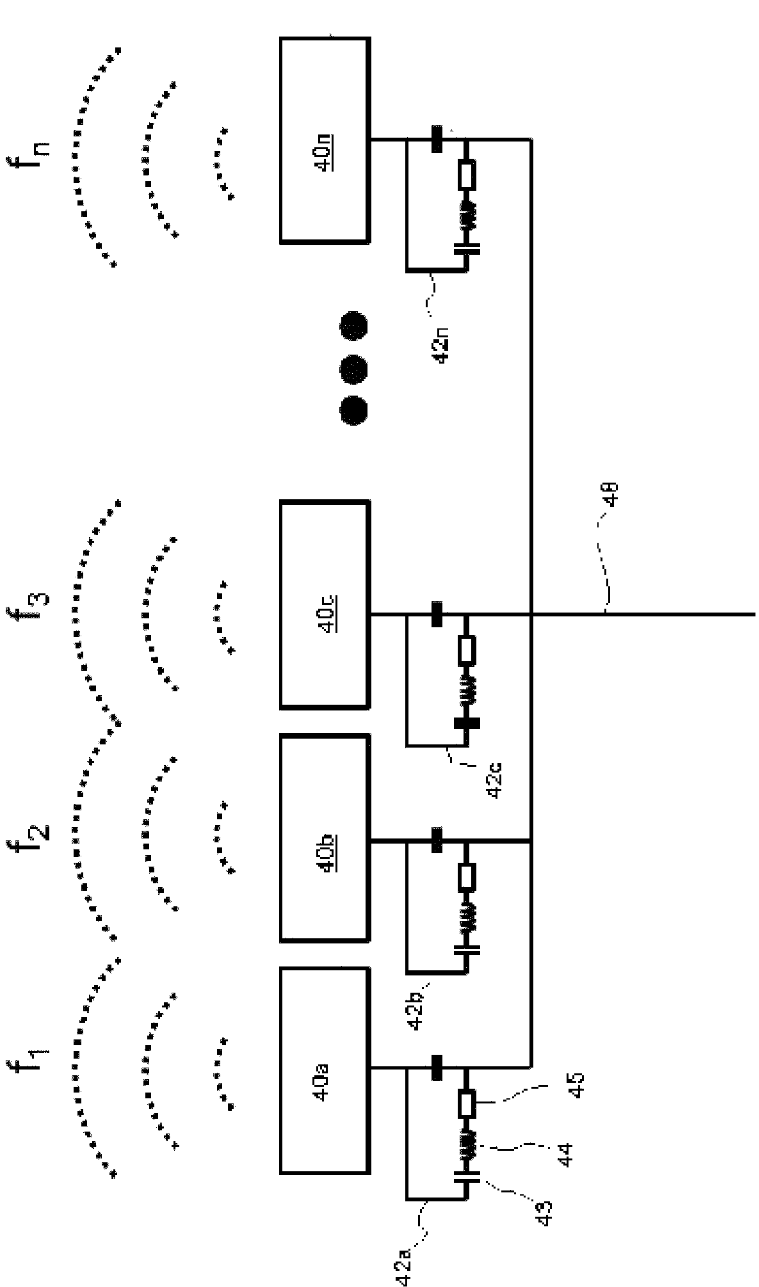
$f_1$
$f_2$
$f_3$
$f_n$
40a
40b
40c
40n
42a
42b
42c
42n
43
44
45
48

52
50
$f_n$
$f_3$
$f_2$
$f_1$
58
59
56
54

60
61
68
65
f [MHz]
$F_2$
64
63
f [MHz]
$F_1$
62

SENSORS AND METHODS FOR GENERATING SPATIALLY ENCODED ACOUSTIC FIELDS BY SOUND-EMITTING APERTURES WITH SPATIALLY VARYING FREQUENCY AND BANDWIDTH

This application claims the priority of International Application PCT/EP2020/053653, filed Feb. 12, 2020, and EP 19176306.9, filed May 23, 2019, from which the PCT application claims priority, the disclosures of which are incorporated herein by reference in their entireties.

FIELD OF THE INVENTION

The present invention relates to an acoustic transducer for spatially frequency encoded acoustic fields, a method of detecting ultrasound using such acoustic transducers, and a method of manufacturing acoustic transducers for a spatially frequency encoded sound field.

BACKGROUND

Today, ultrasound is of fundamental importance in many technical areas, including as a method for imaging, as a sensor in a wide variety of applications (e.g., for measuring flow velocities or distances) or for the targeted introduction of energy into a material or tissue via ultrasonic energy.

For the generation and detection of sound, in particular ultrasound, transducers are used which usually output an acoustic signal in the form of a sound pressure based on an electrical signal (voltage or current) or, conversely, generate an electrical signal based on an acoustic signal which is received via the transducer. Piezo elements may be used for this purpose, for example. Depending on its geometry (e.g., diameter, material thickness) and/or its structuring or other material parameters, each acoustic transducer generates a defined sound field with a natural focus, a specific frequency and a specific bandwidth.

Simple acoustic transducers consisting of one element usually have continuously varying acoustic fields with high symmetry. A strong local variation of sound pressure is only present in the near field. In the far field, sound pressure usually decreases monotonically with increasing distance. Exceptions to this are the so-called side lobes, which produce diffraction-induced local maxima in the sound field according to a relationship between aperture size and wavelength at certain angles. With a single-element sensor, an object- or media-dependent change in the sound field can then initially be detected one-dimensionally, essentially along the acoustic beam or the main lobe formed.

If the generation of structured acoustic fields is desired, lenses or curved apertures are then used, for example, which can then concentrate the sound onto a fixed point. However, the variance or diversity of the acoustic field in this point does not differ significantly from that without a lens or focusing.

Further structuring of the acoustic field is possible using so-called array technology. These arrays usually consist of periodically arranged, individually controlled transducer elements. These should be as identical as possible and emit at the same frequency in order to enable a composition or decomposition of the acoustic field from the fields of the individual elements. By time- or phase-delayed control of these elements against each other, the acoustic field can, for example, be focused onto a point or swept by an angle. In this way, a focusing of the acoustic field can be achieved electronically. The individual delays are calculated based on geometric models. By varying the control over time, an acoustic field can be changed dynamically. However, for good resolutions, large arrays and thus a high technical effort are required, especially due to the large number of channels and connections needed for control and signal acquisition.

Likewise, arrays can also be used to spatially assign the detected signals, i.e., to obtain information about a surface or a volume, e.g., for three-dimensional imaging, three-dimensional surface detection, three-dimensional distance detection or material/tissue characterization. However, the disadvantage remains that with increasing resolution, the manufacturing costs and complexity of the arrays are very high, since for each sensor, i.e., each element of the array, a separate transmit-receive channel is required. In addition, the space requirement is very high despite advanced integration density.

In addition, so-called acoustic holograms or phase plates can be used to generate structured acoustic fields, in which a complex time delay or phase shift of locally resolved ultrasonic waves are topologically encoded. In this way, structured ultrasonic fields can be formed in fluids, for example. However, they are not suitable for airborne sound or low frequency ranges, and attenuation and multiple reflections can pose problems.

BRIEF DESCRIPTION

According to the invention, an acoustic transducer, a manufacturing method for an acoustic transducer and a detection method using such an acoustic transducer with the features of the independent claims are proposed. Advantageous embodiments are subject of the dependent claims and the following description.

In particular, an acoustic transducer for generating and/or receiving a spatially structured acoustic field is proposed, which comprises a total aperture which generates and/or receives the acoustic field, the total aperture comprising a plurality of sub-apertures, each of the sub-apertures being set up to receive and/or generate ultrasound with a specific frequency spectrum, wherein the specific frequency spectra of at least two of the sub-apertures differ from each other, and wherein all the sub-apertures of the total aperture are connected to the same electronic drive channel.

Due to the single, common electronic drive channel, acoustic transducers can be realized in a very small installation space and at low cost without having to sacrifice spatial information of the sound field. The use of only one electrical transmit-receive channel for an ultrasonic sensor can reduce the cost by a factor of 100 to 1000 while increasing the measurement range by a factor of 3. Furthermore, such sensors of different types are applicable for all acoustic ranges, for example as airborne sound, structure-borne sound, in water, in tissue and others.

The multiple sub-apertures may be distributed substantially in a plane perpendicular to the direction of propagation of the acoustic field. The distributed arrangement of sub-apertures of different frequency spectra across the total aperture results in an encoding of spatial information into the signal across the frequency. The term "plane" in this context may also include a predetermined lateral section along the direction of propagation, for example if sub-apertures of different heights or thicknesses are used, or if, for example, the aperture as a whole has a curvature, i.e., it is a curved plane.

One way to generate different frequency spectra using the sub-apertures is to provide sub-apertures with at least partially different diameters. In many embodiments, the diameter of an aperture, e.g., the diameter of a piezoelectrically or capacitively driven membrane, at least partially determines the generated sound frequency.

Preferably, the electrical drive channel may be arranged to output an alternating signal (e.g., an alternating current signal or alternating voltage signal) having a predetermined frequency spectrum, for example a short pulse having a high bandwidth, to the sub-apertures, the alternating signal exciting at least one movable or oscillatable element of each sub-aperture to oscillate. Depending on the technical design, a wide variety of devices can be used as movable elements; while the alternating signal supplied to the sub-apertures is thus initially the same for each sub-aperture, several different frequency spectra may nevertheless be generated as a result of different design and dimensioning of the sub-apertures.

In one possible embodiment, the total aperture may be formed by a piezoelectric element, for example a piezo ceramic or a piezocomposite material, wherein the sub-apertures are formed by regions of different thickness of the piezoelectric element, which may additionally be separated from each other in whole or in part by incision. In this case, the piezo element may preferably be operated in the thickness mode. In this way, a one-piece element with regions of different generated frequencies is obtained, which can be easily manufactured and integrated into other components.

According to a further embodiment, the total aperture may be formed as a piezoelectric or capacitive micromechanical transducer, wherein the plurality of sub-apertures are formed as a plurality of cavities or membranes of the transducer arranged above the cavities, and wherein the membranes have at least partially different diameters. These microsystem elements allow a particularly small design and simple integrated manufacturing with other elements, and may therefore be used for a variety of sensors.

In an alternative embodiment, a total aperture may be formed from a high bandwidth single acoustic transducer together with a passive attachment module for the single acoustic transducer, the passive attachment module comprising regions of different frequency-dependent attenuation forming the plurality of sub-apertures. The different frequency spectra of the sub-apertures are thus generated by local modulation of the single acoustic transducer, wherein the regions may have at least partially different frequency-dependent attenuation curves.

Another possibility is to form sub-apertures by means of individual acoustic transducers of high bandwidth, each of the individual transducers being preceded by an electronic filter which limits the bandwidth of the individual transducer to a specific frequency spectrum. In this variant, for example, it is particularly easy to use identical individual acoustic transducers which are arranged in a manner similar to an array, but which are all contacted together via the one electronic drive channel. The different frequencies and thus the spatial frequency coding result from the filtering.

In another embodiment, the total aperture may be formed by a passive base body having recesses for a plurality of individual transducers, the plurality of individual transducers forming the plurality of sub-apertures. In a modular fabrication, a plurality of sound fields may be formed here from a prefabricated set of matching individual transducers and matching recesses of the base body by flexibly adapting or exchanging the elements used in each case.

Furthermore, a transducer device may also be formed from each of the previously described transducers, which comprises a plurality of periodically arranged transducers according to one of the preceding embodiments, each transducer having a separate electronic drive channel and being connected thereto. In this way, an array is again formed which, however, requires considerably less complexity and effort, in particular for the drive or detection channels, in comparison with conventional transducer arrays.

A method of manufacturing an acoustic transducer as previously described is also proposed, in which a desired spatial acoustic field distribution of a total aperture is first predetermined, and then parameters of a plurality of sub-apertures forming the total aperture may be obtained from the desired sound field distribution, wherein the obtaining of the parameters may be based, for example, on an analytical calculation of the parameters, a numerical calculation of the parameters, or a simulation method for the parameters. Thus, a specifically structured acoustic field may be formed, for example forming a defined focus or other spatial distributions as required for many purposes such as imaging or material processing. Alternatively, a randomized acoustic field distribution may be used for specific purposes.

In particular, in order to obtain the parameters of the sub-apertures, partial acoustic field distributions with a specific frequency spectrum may first be calculated in such a way that a superposition of all partial acoustic field distributions results in the desired spatial acoustic field distribution, and then the suitable parameters of the sub-apertures are determined or calculated for each of these obtained partial acoustic field distributions. The following, for example, may be used as parameters of the sub-apertures to be determined, either individually or in any suitable combination: dimensions of a sub-aperture, a geometric shape of a sub-aperture, a thickness of a movable element of a sub-aperture, a relative arrangement of a sub-aperture within the total aperture. It is also possible that certain parameters of the sub-apertures are given and cannot be changed, for example due to material properties or specifications for the manufacture of a particular transducer, while others such as the shape may then be adjusted within certain limits or arbitrarily until the desired acoustic field distribution is achieved. In other embodiments, however, all of the parameters of a sub-aperture could be freely varied, such as when an aperture is being completely redesigned and the optimal shape for a desired acoustic field is to be found.

Furthermore, a method for decoding a spatially structured acoustic field using a frequency-coded acoustic transducer as described above is proposed, comprising the following steps: First, an ultrasonic signal is detected using the acoustic transducer, which comprises reflected signals of an irradiated acoustic field, wherein the irradiated acoustic field has a predetermined spatial structure and optionally may also be generated by the transducer used for reception (pulse-echo operation), and then, based on the detected signal and the predetermined spatial structure of the irradiated acoustic field, the spatial distribution of reflecting elements generating the reflected signals is calculated. In this case, the detected ultrasonic signal is preferably present as an output signal of the one electrical drive channel of the acoustic transducer and may then be processed accordingly.

For example, the spatial distribution of reflectors or reflecting elements calculated in this way may then be used to construct and display a two- or three-dimensional image.

The frequency-coded transducers described are of great advantage in many special fields of application. Since, for example, only one signal needs to be controlled or received and the resulting data volumes are significantly lower than in the state of the art, such solutions are particularly suitable for connection via radio interfaces. Power consumption and the payload or size are also reduced, so that systems in catheters in medical technology, for example, can be optimally designed. There are also major advantages in the field of sonar. The transducers described are easily scalable in terms of both size and frequency ranges without losing their advantages and properties, and can therefore be used for a wide range of applications.

Further advantages and embodiments of the invention will be apparent from the description and the accompanying drawings.

It is understood that the above features, and those to be explained below, may be used not only in the combination indicated in each case, but also in other combinations or alone, without departing from the scope of the present invention.

The invention is illustrated schematically with reference to examples of embodiments shown in the drawing, and is described below with reference to the drawing.

FIGURE DESCRIPTION

FIG. 1 schematically shows a total aperture of a transducer comprising several sub-apertures of different sizes, according to one embodiment;

FIGS. 2*a*, 2*b*, and 2*c* show transducer variants with differently shaped sub-apertures and total apertures;

FIG. 3*a* shows a height-structured piezoceramic transducer according to one embodiment;

FIG. 3*b* shows an exploded view of the piezoceramic from FIG. 3*a* with contacting electrodes, FIG. 3*c* shows two variants of acoustic radiation for a transducer according to FIG. 3*a*, FIG. 3*d* shows a possible installation of a transducer according to FIG. 3*a* in a housing;

FIG. 4 shows another embodiment in which sub-apertures with different frequency spectra are formed by electronic filters;

FIGS. 5*a* and 5*b* show another embodiment in which sub-apertures with different frequency spectra are formed by a transducer with a passive attachment module;

Figure 8:
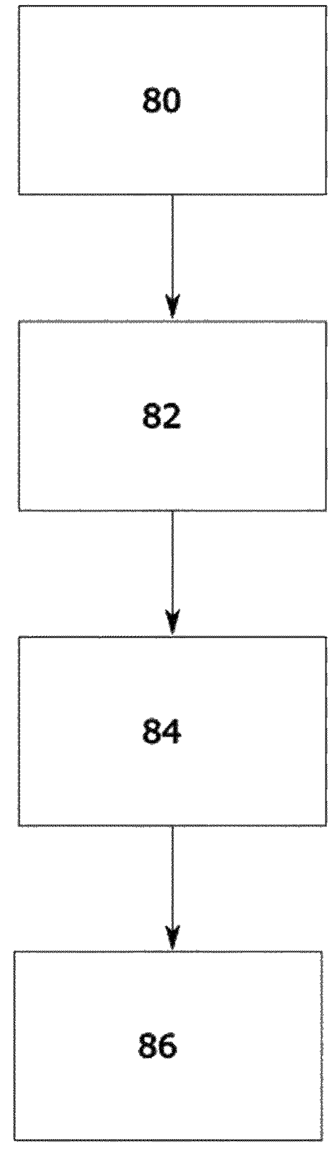
Figure 9:
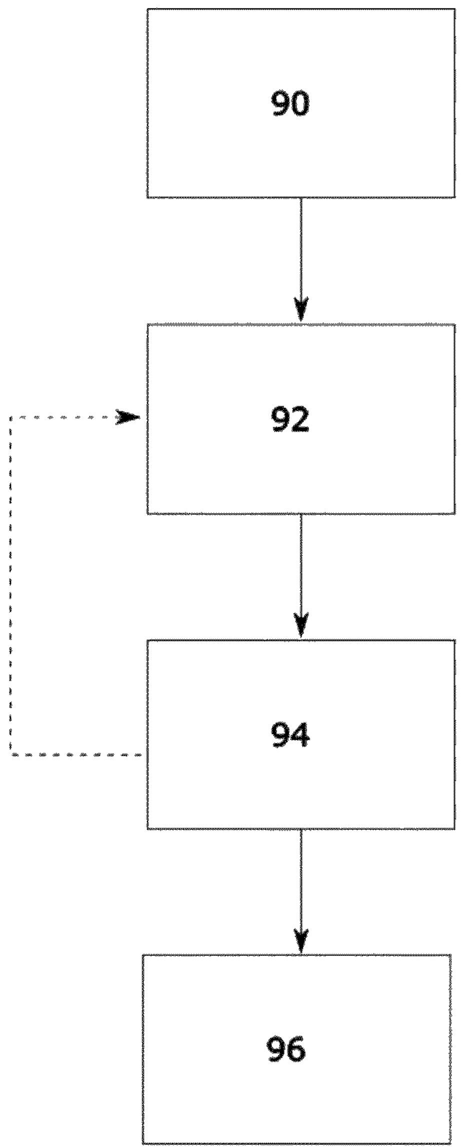

FIG. 8 schematically illustrates process steps for detecting ultrasound using an exemplary acoustic transducer, and FIG. 9 schematically illustrates steps of a manufacturing process for an exemplary transducer.

DETAILED DESCRIPTION OF EXEMPLARY EMBODIMENTS

In the following, some exemplary embodiments are described, in which a frequency coding of an acoustic field is achieved in different ways, by composing the field in a plane perpendicular to the direction of propagation, i.e., in lateral extension, from partial acoustic fields of specific frequency spectra, which then form the frequency-coded acoustic field of the total aperture by superposition. By combining different frequencies or frequency spectra with the spatial information, which is introduced into the superimposed total acoustic field by the place of origin of the respective frequency, a spatially structured, frequency-coded acoustic field is obtained.

In this case, the total aperture is only controlled by a single transmit/receive channel, i.e., also only with one input signal, e.g., in the form of an AC voltage. The different frequency spectra from which the superimposed total signal is formed are thereby preferably generated by locally different properties of the acoustic transducer. Similarly, a single frequency-encoded detection signal may provide spatial information by means of suitable reconstruction algorithms.

The basic principle of the invention can be used with essentially any technique of ultrasound generation, as long as it is possible to generate locally different acoustic frequencies depending on characteristics of an aperture. In this context, ultrasound is to be understood as a range of acoustic frequencies starting above the audible sound spectrum, i.e., approximately above 20 kHz and extending into the GHz range. Medical applications, for example, are often in the MHz range. In general, however, audible frequency components may also be present in the application of ultrasound; the generation of the sound waves and also the superimpositions described here for spatial frequency coding do not differ according to their principle.

In general, acoustic transducers may be used both as transmitters and as receivers; in this case, an applied signal, e.g., an alternating current signal at the respective structure, ensures that a corresponding element is excited to oscillate and thus generates the ultrasonic waves, while conversely, when an ultrasonic wave impinges on the element and thereby triggers oscillations of the element, an electrical signal is generated which may be read out again and processed further. It will therefore be understood that all of the examples of an ultrasonic transmitter set forth below may likewise be applied to an ultrasonic receiver and vice versa, even though the respective example may only be described specifically for sound generation or sound reception.

One way of generating a spatially frequency-encoded sound field from a single drive signal or decoding a three-dimensional sound field from a single incoming signal is based on providing an aperture with substructures or sub-apertures, each of which has specific frequency spectra and/or bandwidths. The sound field is then formed additively or subtractively from the individual frequency spectra of all sub-apertures. In principle, the frequencies of the sub-apertures may also be at least partially the same, but can also differ from sub-aperture to sub-aperture.

Figure 1:
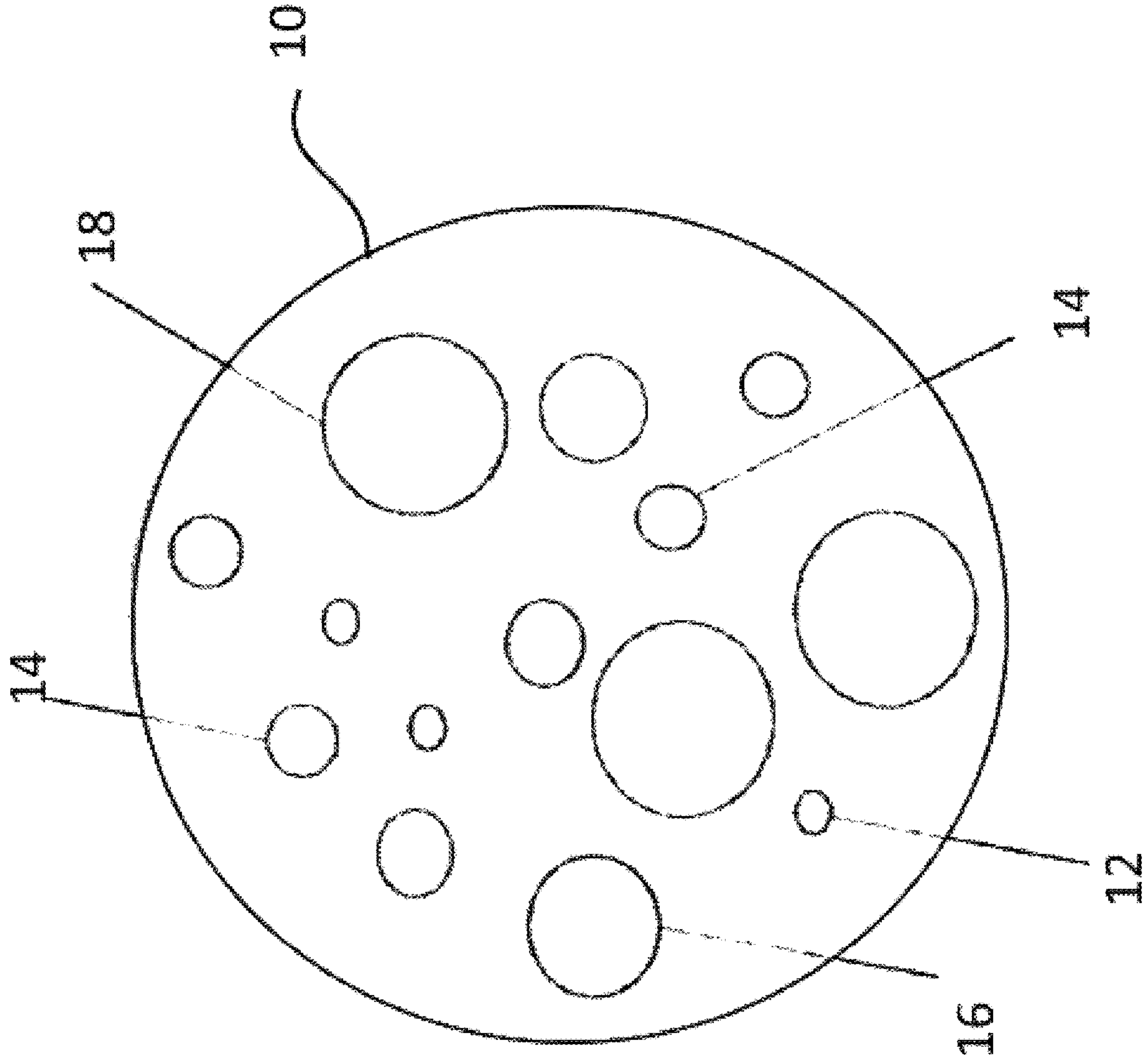

FIG. 1 shows a schematic representation of such a transducer having a total aperture 10 comprising a plurality of sub-apertures 12, 14, 16, 18 of different sizes. Preferably, the sub-apertures are otherwise designed such that the different sizes or diameters result in different generated frequencies in each case. It is also possible for a plurality of sub-apertures to be of the same design or, for example, for a certain number of basic types to be predetermined for the sub-apertures, which are then combined as desired to form a total aperture. For example, two or more sub-apertures 14 may have the same diameter and specific frequency, while other sub-apertures 12, 16, 18 may have larger or smaller dimensions. Other parameters of the sub-apertures may also be altered, such as thickness or mobility of a membrane, so that different frequencies may possibly be produced even if the diameters are the same. All sub-apertures together, over their total area, form the total aperture 10. In this regard, this illustrated basic principle may be applied to various embodiments.

An exemplary embodiment for a transducer 10 as shown in FIG. 1 is a MEMS (microelectromechanical systems) sensor, i.e., a sound transducer manufactured using microsystems technology on the basis of vibrating membranes, for example as a piezoelectric transducer (PMUT, piezoelectric micromachined ultrasonic transducer) or as a capacitive transducer (CMUT, capacitive micromachined ultrasonic transducer).

CMUT transducers are ultrasonic transducers whose sound generation is based on an electrostatically induced displacement and an associated change in distance. A CMUT transducer may have a cavity in a silicon substrate that serves as a first electrode and may be covered by a thin, metallized membrane that serves as a second movable electrode. When an AC signal is applied to the two electrodes, the membrane is excited to vibrate and ultrasonic waves are generated so that the CMUT transducer operates as a transmitter. On the other hand, when the membrane is vibrated by incident ultrasonic waves, the capacitance of the CMUT transducer changes, an alternating signal is generated, and the CMUT transducer operates as a measuring unit. Modifications or further developments such as polymer-based CMUT elements (polyCMUT) may also be used.

In a similar way, a PMUT transducer is based on the fact that a piezoelectric membrane with contacting electrodes is mounted on a micromechanically fabricated cavity, e.g., in a silicon substrate, which generates or receives the ultrasonic field.

Advantages of these microsystem elements are, for example, that they are easy to manufacture, small in size and low in cost, and may also be manufactured in an integrated manner.

With this type of sensor or transducer, the frequency can now be diversified, for example, solely based on the membrane diameter or the diameter of the cavities.

For example, a total aperture 10 of a CMUT or PMUT could be formed as in FIG. 1 and may have multiple membranes 12, 14, 16, 18 of different diameters as sub-apertures. The different diameters then provide different natural modes and thus different excited ultrasound frequencies. Likewise, the arrangement of the multiple sub-apertures 12, 14, 16, 18 may also be adjusted to change the acoustic field composed of the individual frequencies or individual frequency spectra.

Furthermore, it is also possible to change the shape of the membrane or cavity, e.g., in order to realize different frequencies for a vibrating membrane with electrode of a CMUT with the same lateral dimension due to the dependence of the natural vibration spectrum on the shape (round, square, hexagonal, etc.). The basic shape of the total aperture may be left unchanged or may also be modified, e.g., to achieve a specific spatial distribution of the membranes.

FIG. 2 shows three exemplary embodiments of composite apertures, which may again be designed, for example, as CMUT or PMUT elements.

Figure 2C:
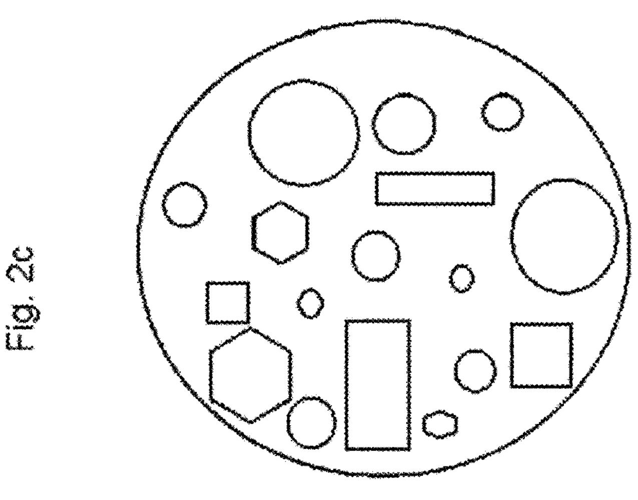
Figure 2B:
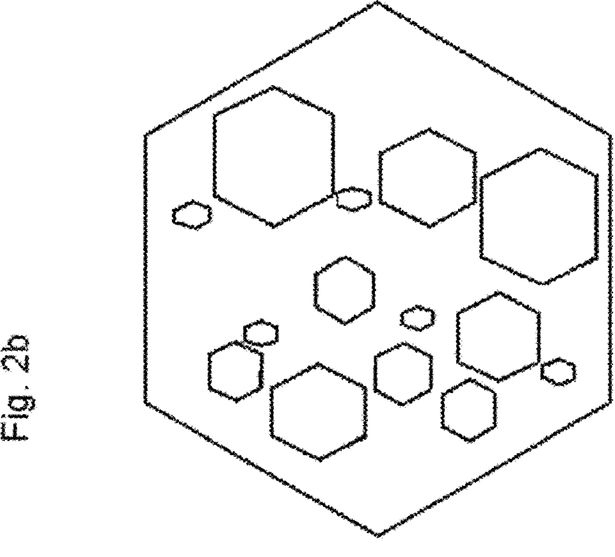
Figure 2A:
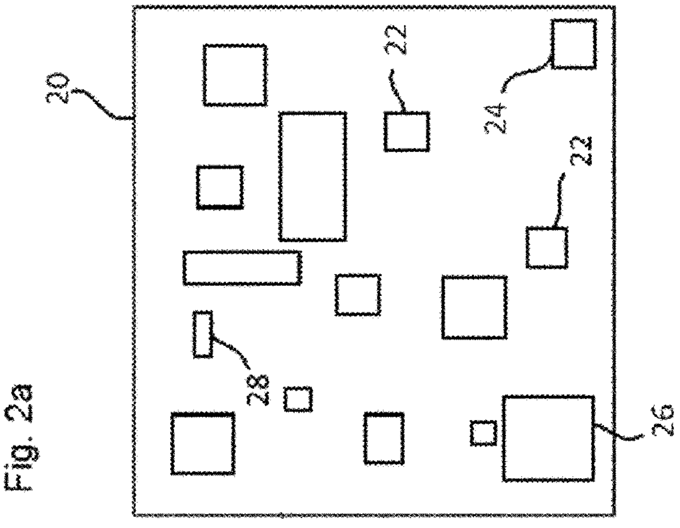

FIG. 2*a* shows a variant with a rectangular basic shape of the total aperture 20 as well as several rectangular membranes 22, 24, 26, 28 as sub-apertures. As in the previously described embodiment, the membranes may have different as well as partially equal diameters, the respective diameters being selected such that the generated frequencies and local distributions of the vibration generators result in the desired acoustic field. The basic shape of the sub-apertures may also differ to a greater or lesser extent; membranes of the same shape, only with varying diameters, could be used, as well as membranes with different rectangular shapes as shown. Here, the membranes may be symmetrical like elements 22, 24, and 26, or only partially symmetrical like element 28, which can also have an influence on the relevant vibration modes, for example.

FIG. 2*b* shows a hexagonal basic shape as an aperture with several hexagonal membranes, while FIG. 2*c* shows a round aperture with sub-apertures or membranes of different shapes and diameters. FIG. 2*c* shows a round aperture with sub-apertures or membranes of different shapes and diameters, including circular, rectangular and hexagonal membranes. It is understood that the shapes and sizes can be chosen arbitrarily and other symmetrical or asymmetrical shapes for the apertures and sub-apertures are also conceivable, which enable a favorable production of the membranes and attachment of the piezoelectric elements or movable electrodes and whose frequency spectra generate the desired acoustic field in total.

All variants shown in FIGS. 2*a* to 2*c* can be implemented in particular with any microsystem-engineered transducers, in particular the CMUT and PMUT elements already described.

For example, in addition or as an alternative to the variations described above, the thickness of the membrane or movable plate in a CMUT or PMUT element may also be varied across the aperture, which also results in a change in frequencies due to the change in vibrational characteristics.

The determination of the suitable diameters, shapes and arrangements of the individual sub-apertures can be selected according to certain specifications or found, for example, by appropriate numerical and/or analytical calculations, simulation methods and approximations. A randomized arrangement and parameter selection is also possible.

As has been described in general terms, the entire aperture with the various different membranes is electrically contacted by a single signal channel through which, when used as an ultrasonic transmitter, an alternating voltage can be applied to the electrodes/piezoelements, while when used as an ultrasonic receiver, a single modulated signal can be received through the signal channel of the aperture and then the three-dimensional information can be obtained by appropriate signal processing.

Another possible embodiment is based on sensors based on piezo-active materials, for example piezoceramics such as lead titanium zirconate (PZT), piezoelectric composites such as 1-3 composites which typically comprise piezoceramic elements combined with a polymer, PVDF films with piezoelectric effect, printed or deposited piezo-active materials, and others. Also in this case, the different frequencies to combine the desired acoustic field and thus the spatial coding of the acoustic field can be achieved by suitable patterning across the total aperture.

Figure 3B:
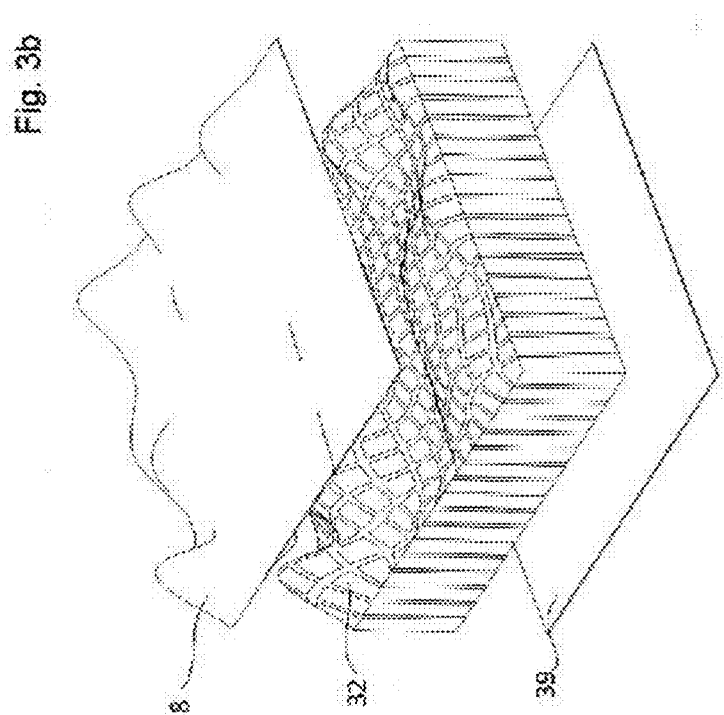
Figure 3A:
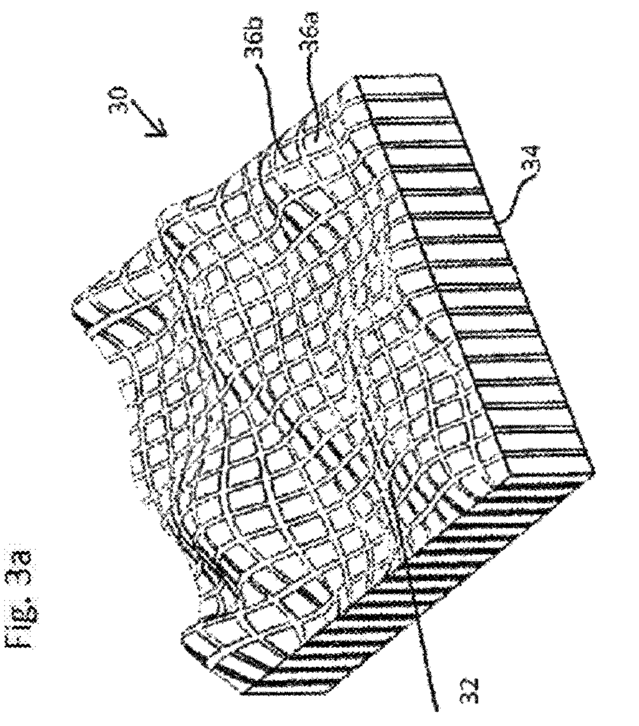

As a rule, transducers based on piezoelectric ceramics are operated in the thickness mode. Frequency coding can therefore be realized in this case by varying height profiles in the plane of the active area. FIG. 3*a* shows an example of such a total aperture formed by a structured piezoceramic 30 of varying thickness as a schematic 3D view. Due to the different thickness 32 of the ceramic material, the element emits different ultrasonic frequencies at different locations 36*a*, 36*b* of the aperture. The resulting frequency signal of the total aperture is thus a superposition of frequency signals from all sub-regions with different thickness.

Areas of different thickness 36*a*, 36*b* may be considered as individual sub-apertures. The regions of different thicknesses may thereby transition continuously into one another as in the figure, or may alternatively be formed completely or partially separated from one another by suitable lateral structuring, such that separate sub-apertures are formed.

As shown in the figure, one of the two base surfaces 34 may be planar, while the other surface 32 is provided with the height profile. FIG. 3*b* shows the overall structure of a piezoceramic as in FIG. 3*a* with the contacting electrodes 38 and 39 arranged on both base surfaces. Likewise, in principle, a structure is possible in which both base surfaces are structured and there is no purely planar surface.

Figure 3C:
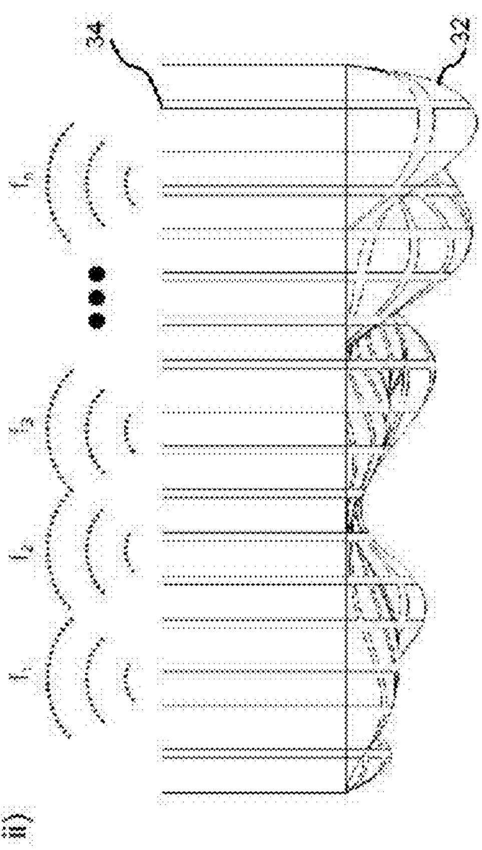
Figure 3C:
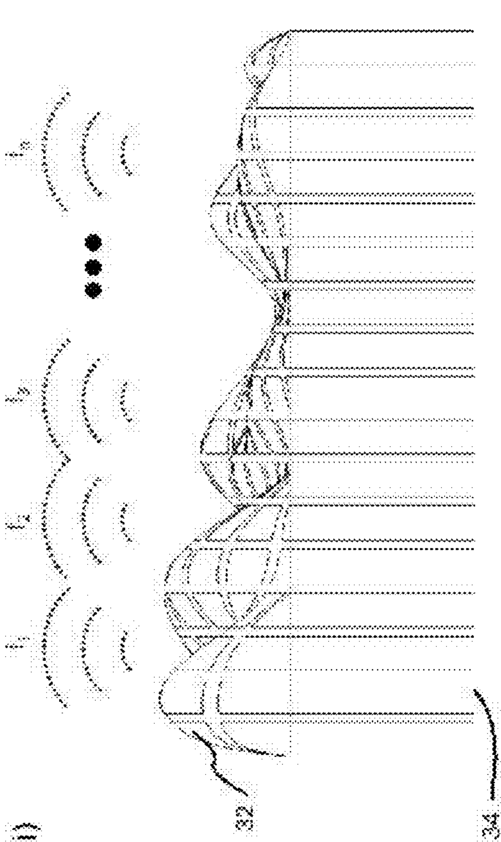

FIG. 3*c* shows two cross-sections through such a piezoceramic, wherein in the first alternative i) the acoustic radiation is shown via the curved surface 32 as an aperture, while in the second alternative ii) the planar surface 34 is provided as an aperture and the acoustic radiation thus takes place via this surface. In particular, the use of the planar surface 34 as an aperture enables a problem-free installation, for example, in suitable housings.

Figure 3D:
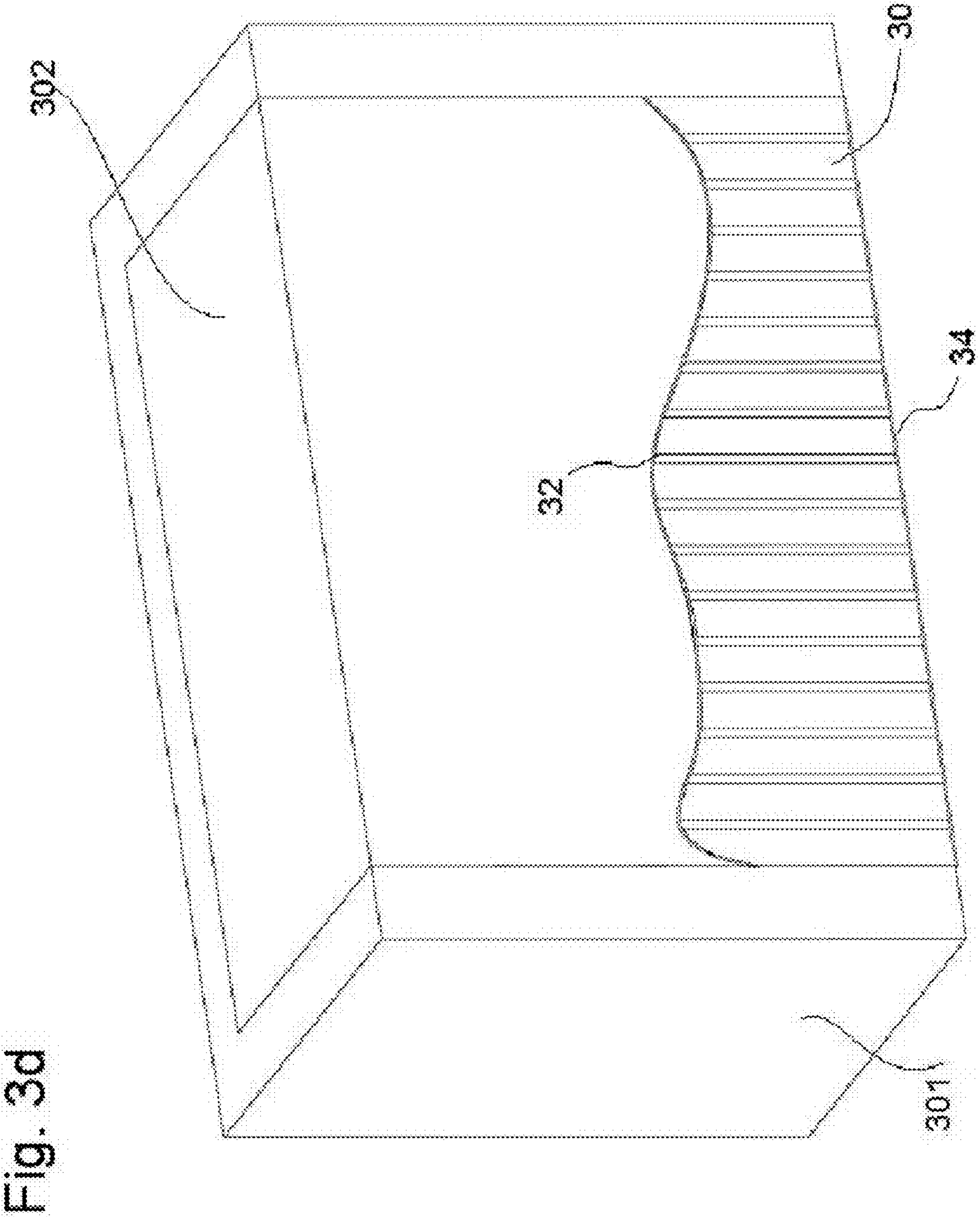

Such a structure is shown in FIG. 3*d*, in which a piezoceramic element with a height profile is inserted into a housing 301 as an acoustic transducer 30. The lateral surfaces and dimensions of the housing 301 may be chosen freely and can therefore simply be vertically flattened as shown here. Here, the upwardly facing planar outer surface 34 forms the sound-generating or sound-receiving aperture of the piezoceramic element 30. In contrast, the height-profiled surface 32 of the piezoceramic is embedded in or molded into, and optionally fixed by, a suitable carrier material 302, which also fills the remainder of the housing. The support material 302 may simultaneously serve as a fixation for the piezoceramic 30 in the housing 301. Electrical contact via the actuation channel is not visible in this figure, but may again be made via planar electrodes as in FIG. 3*b*.

While the foregoing examples were based on a total structure having spatially varying substructures for generating different acoustic frequencies, embodiments may also be selected in which individual structures having specific frequency spectra are assembled to form a total aperture.

In another possible embodiment for generating and/or detecting a frequency-encoded acoustic field, a neutral base body is provided in which a plurality of recesses or inserts for single-element acoustic transducers are provided, which form the sub-apertures. The basic shape can thereby be formed, for example, as in FIG. 1 or as in FIGS. 2 *a* to *c*, so that the basic body forms the total aperture 10 or 20, while the recesses or inserts can correspond to the membranes 12, 14, 16, 18 or 22, 24, 26, 28 described therein and can be shaped accordingly, for example as rectangular individual acoustic transducers in a basic body of any desired shape. All single-element acoustic transducers in the base body are again contacted together electrically. The acoustic transducers may have different frequencies and bandwidths, for example by appropriate choice of their diameter or other parameters. The combination of all specifically arranged individual acoustic transducers then forms the total aperture with the base body.

For flexible production of such elements, it is also conceivable to find a suitable variant adapted to respective application conditions from a combination of a given basic body with a number of N recesses or inserts for acoustic transducers as well as N acoustic transducers which can be inserted into these recesses. Thus, in combination N! different acoustic field variants may be found and adapted accordingly. Likewise, different insertable transducers could be used for inserts with intended diameters, for example with different membranes and excitation characteristics. An ideal assignment of N transducers to N positions or inserts in the basic body may be identified using a numerical solution method.

Further embodiments rely on local modulation of the frequencies of substructures based on a high bandwidth basic structure.

FIG. 4 shows such an example, in which individual sub-apertures in the form of individual acoustic transducers 40*a*, 40*b*, 40*c*, . . . , 40*n* are used, which are again all controlled via a common electrical channel 48, but are then provided with different spectral filters 42*a*, 42*b*, 42*c*, . . . 42*n* for local modification of frequencies. In this respect, the individual sub-apertures 40*a*, 40*b*, 40*c*, . . . 40*n* may also be similar to each other or even identical, such that manufacturing becomes particularly simple. Preferably, the sub-apertures should have a very high bandwidth in order to allow sufficient variation of the frequencies by filtering. The spectral filters 42*a*, 42*b*, 42*c*, 42*n* may be implemented by appropriate electrical circuits. In this way, specific frequencies and bandwidths can be assigned to the individual sub-apertures. For example, common RLC elements comprising resistors 45, coils 44 and capacitors 43 may be used as filters and modified for each of the sub-apertures as desired for the required frequencies. For example, PVDF membrane-based transducers are suitable for generating a high bandwidth. Equally, however, the sub-apertures may be formed from other elements. For example, when using microsystem-based transducers (CMUT, PMUT) for the individual sub-apertures, the transducers with the associated electronic filters can be integrated directly on a silicon wafer. In the figure, a row of acoustic transducers is shown side by side, but these could also be provided in any arrangement, for example circular or as a grid with multiple columns and rows. All filtered transducers 40*a*, 40*b*, 40*c*, . . . , 40*n* then in turn form the total aperture with a superimposed frequency spectrum from all sub-apertures.

Figure 5A:
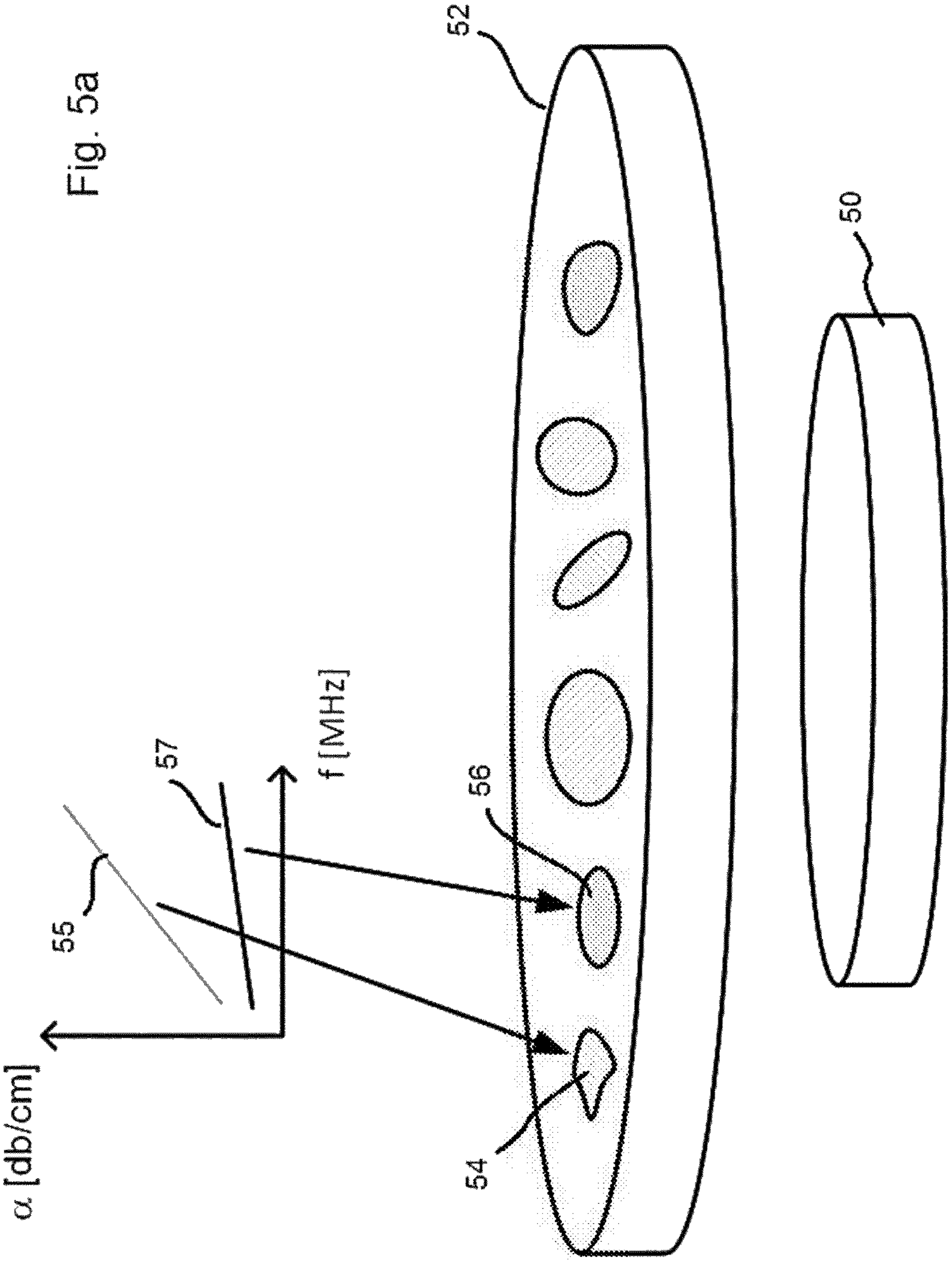
Figure 5B:
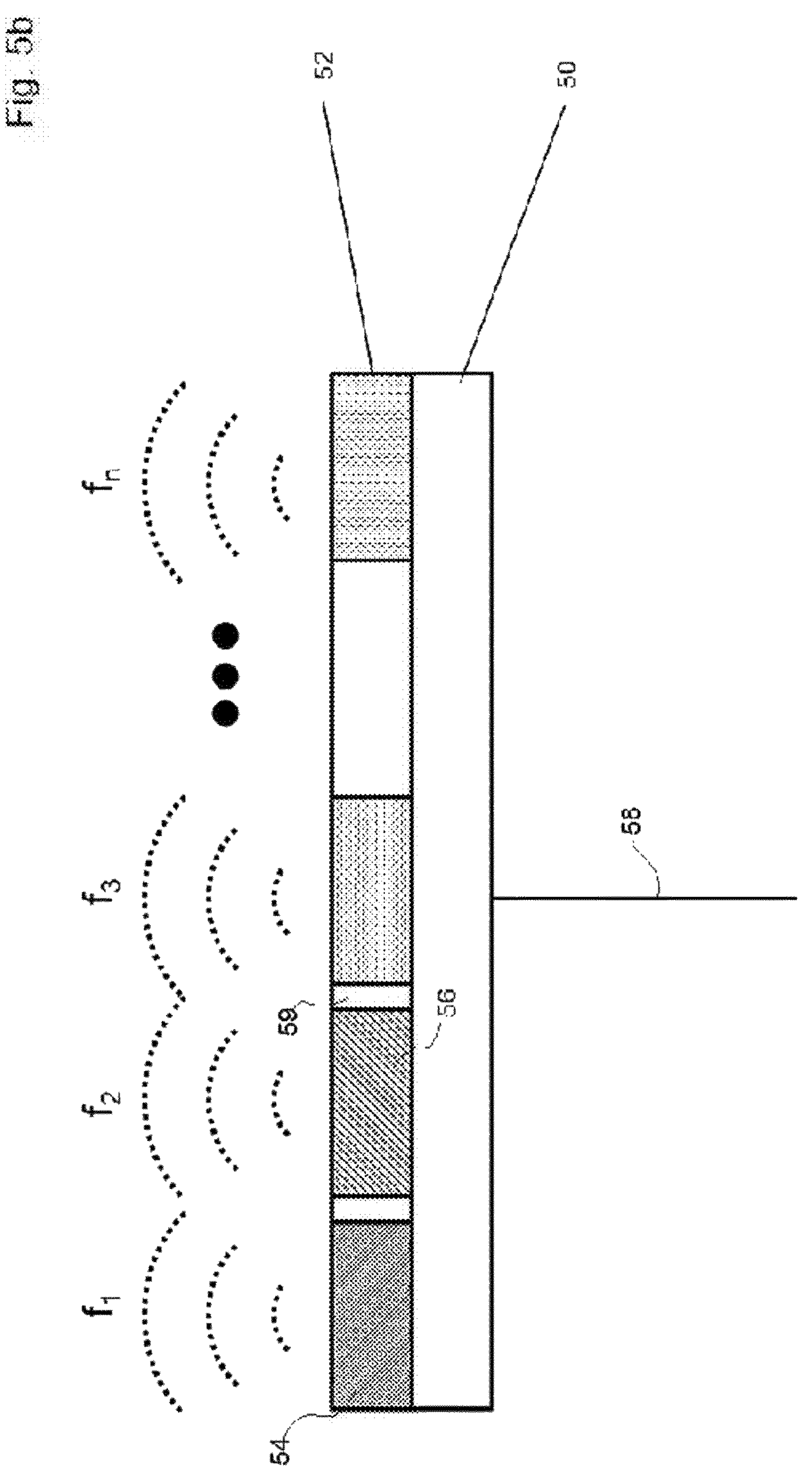

Another embodiment uses a passive add-on module or attachment module for a transducer. This is shown as an example in FIG. 5*a*. Here, a single aperture (i.e., a single acoustic transducer) 50 with a preferably high bandwidth is preceded by a passive add-on module 52, which at least partially transmits the generated sound and leads to spatially variable specific frequencies and/or bandwidths. The transducer is again connected to only one drive channel 58. This can be realized, for example, by providing the passive attachment module 52 with regions 54, 56 of different frequency-dependent attenuation in a location-dependent manner (again, distributed over the aperture plane or substantially parallel thereto). FIG. 5*b* shows a composite total aperture according to FIG. 5*a* in cross-section, whereby the acoustic transducer 50 can be permanently or exchangeably connected to the attachment module 52. The sound generated by the acoustic transducer 50 is thus transmitted through these different areas 54, 56 after leaving the aperture, so that different sub-apertures with different specific frequencies and bandwidths f1, f2, f3, . . . fn are formed behind the attachment module in accordance with the distribution of the attenuation properties. FIG. 5*a* also shows, by way of example, corresponding schematic attenuation curves 55, 57 and the sound absorption coefficient $\alpha$ in db/cm plotted against the acoustic frequency for two of the attenuating regions or the sub-apertures. While linear attenuation curves are shown here, depending on the material, other frequency-dependent curves may also occur and be used. In the example shown, area 54 has a stronger attenuation 55 over all frequencies, but especially for high frequencies, than the area 56 with the attenuation curve 57.

Optionally, a passive attachment module 52 may be at least partially transmitting throughout its entire aperture area or may be configured such that areas 59 between the individual sub-apertures from which no sound or acoustic wave emanates are also formed on the side facing away from the acoustic transducer 50 (i.e., the radiating area of the aperture). Such passive modules 52 can be easily manufactured and modified so that a variety of differently structured acoustic fields can be generated using a common broadband acoustic transducer 50 and, for example, interchangeable attachment modules 52. Depending on the material used, passive attachment modules may be manufactured in a particularly simple and inexpensive manner and specifically adapted to applications. Once again, other basic shapes than those shown may be used, for example based on the shapes already shown schematically in FIG. 2.

Figure 6:
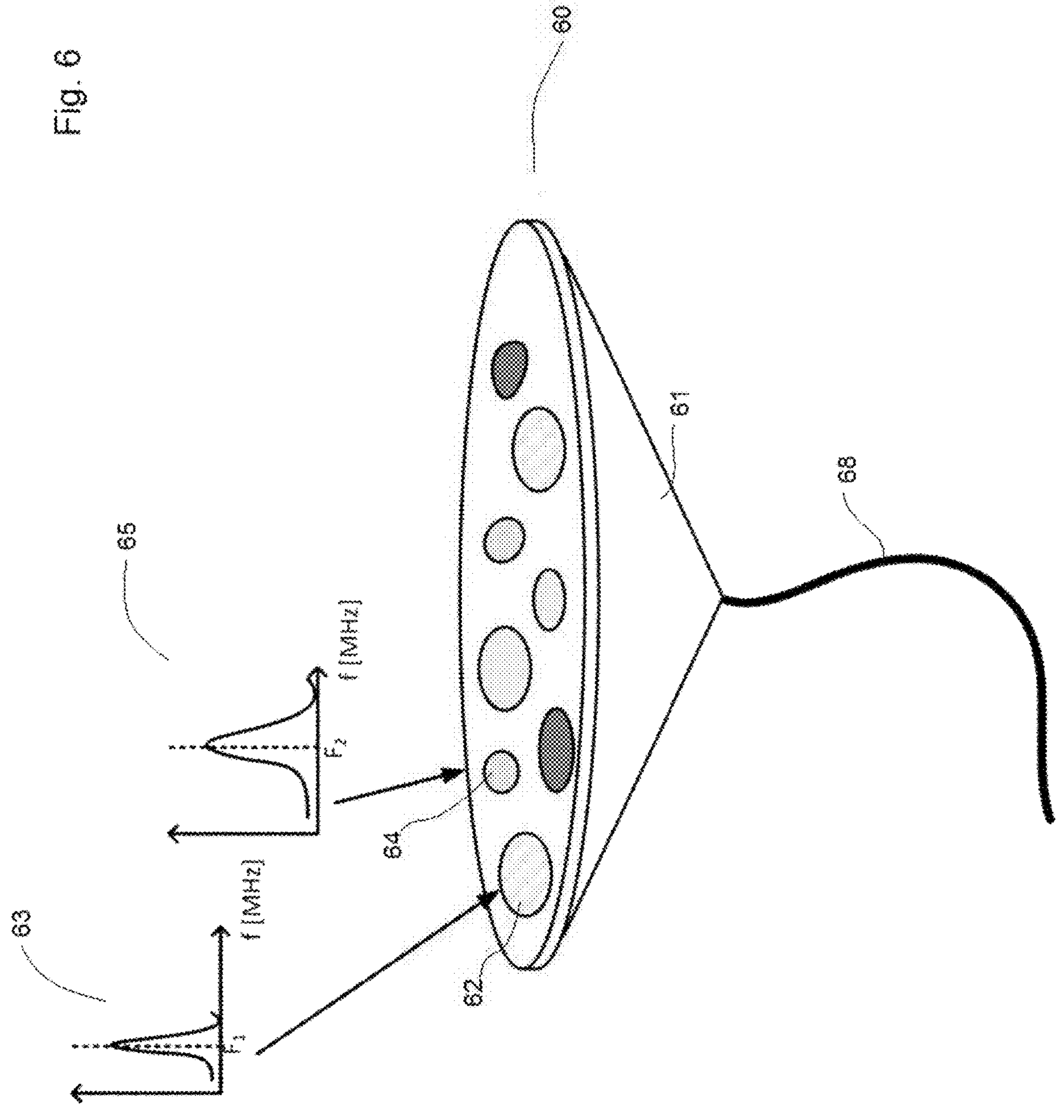
FIG. 6 shows an embodiment in which ultrasound is generated by photoacoustic excitation at a membrane.

In addition to sound generation by piezoelectric or capacitive transducers of all different designs, other possibilities of ultrasonic generation can also be considered for the present invention, for example the generation of photoacoustic sound waves by pulsed laser beam, as shown in FIG. 6. Absorption of the energy of the laser beam 61 on an absorbent material provides local heating and expansion for a short time, such that repeated pulses of appropriate length and frequency (e.g., in the range of nanoseconds) irradiating a membrane 60 or other suitable element produce vibrations of the membrane and hence corresponding ultrasonic fields. If such a membrane 60 is formed with local regions 62, 64 of different thickness and/or absorption, as shown in FIG. 6, and then illuminated with pulsed laser light 61 of suitable pulse frequency, ultrasonic signals can be generated which are again spatially and spectrally encoded. In this regard, the membrane regions 62, 64 with different parameters form the sub-apertures as in the previous examples. Exemplarily, two of the resulting frequency curves 63, 65 for the regions 62, 64 are shown in the figure. Similarly, again, the regions of different absorption or different vibration characteristics may merge directly into one another or be separated from one another by other regions so that, for example, sections may be provided on the membrane 60 which do not absorb or hardly absorb in the corresponding wavelength ranges.

The one channel for excitation or control of the transducer here corresponds to an irradiation of laser pulses 61 with predetermined frequency and pulse duration as well as predetermined wavelength through, for example, a laser fiber 68 onto the total aperture. Also, a tunable laser allowing a change of the wavelength in a certain range could be used for excitation. Once again, the basic round shape is shown only as an exemplary embodiment and may be substituted for other shapes.

In principle, all other sound generation methods may also be used for embodiments of the invention, as long as it is thereby actively or passively possible to achieve a spatial variation of the emitted ultrasonic frequencies. For example, methods are also conceivable in which the ultrasonic signal is generated by mechanical, electromagnetic, electrodynamic (inductive), electrostrictive or other processes.

Figure 7:
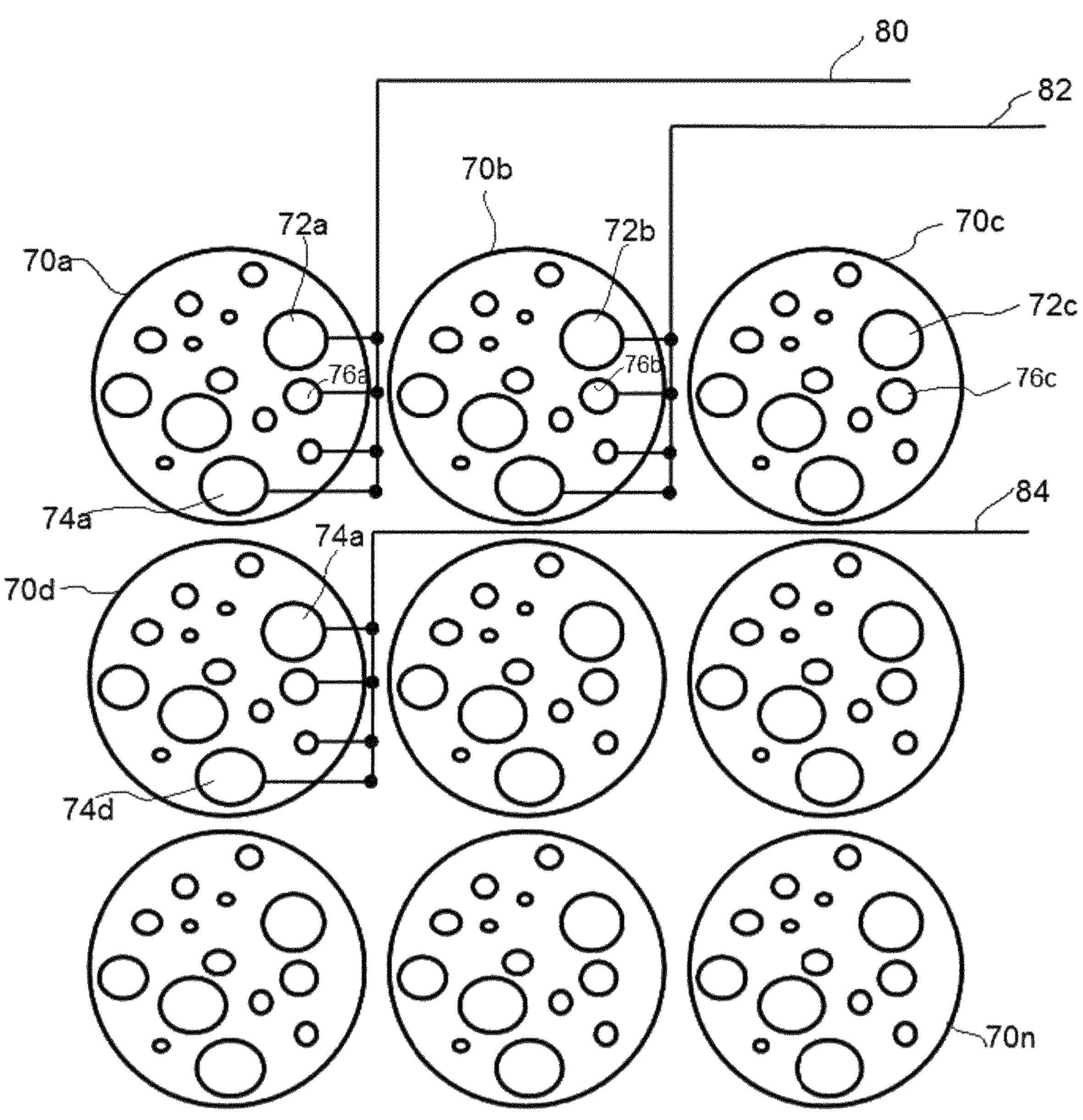
FIG. 7 shows an array of several exemplary transducers according to the invention.

As shown in FIG. 7, several frequency-coded transducers 70*a*, 70*b*, 70*c*, 70*d*, . . . 70*n* with sub-apertures 72*a/b/c*, 74*a/b/c*, 76*a/b/c* can be connected to form an array as described above in a further embodiment. In this way, a significantly expanded field of view or a larger working area can already be covered with significantly fewer array elements and, in particular, with reduced technical and electronic effort than usual. Many individual working volumes are combined into a large total volume with a known position of the individual transducers. Thereby, as in a conventional array, each of the transducers 70*a*, 70*b*, 70*c* according to the invention can be controlled individually via the channels 80, 82, 84, while the sub-apertures 72, 74, 76 of the transducers for each specific total aperture are controlled jointly via these channels, respectively. Here, for clarity, only individual sub-apertures and apertures are shown in the figure as examples with contacting or electrical channels, while usually, of course, all associated sub-apertures are each connected to the drive channel of the respective transducer and each transducer in the array has its own drive channel, even if not shown in this figure. This embodiment may be combined with any of the previous embodiments; for example, an array of microsystem transducers could be formed as in the examples to FIGS. 1 and 2; but equally an array could be formed by forming, for example, four defined groups of transducers in a single passive base body having a plurality of individual transducers, preferably according to their spatial arrangement, and an electrical drive channel provided for each group, so that each group of individual transducers or sub-apertures together each forms an total aperture.

All of the transducers described above and their variations may be used as sound generators and/or sound receivers. For imaging and other detection methods, the same transducer can preferably also be used simultaneously as transmitter and receiver; in principle, however, two separate acoustic transducers can also be used for this purpose, as long as the acoustic field emitted by the generating acoustic transducer is known and can thus be used to interpret the reflected and scattered signals.

In order to achieve a spatially unambiguous assignment from the received signals of such a transducer with a spatially frequency-coded acoustic field, various calculation methods can be applied.

In essence, it may be considered that a spatially frequency encoded acoustic field of an emitting total aperture comprises a superposition of the acoustic fields of the different sub-apertures, each of the sub-apertures having a specific frequency spectrum and an associated amplitude. The resulting acoustic field may be represented by a function $$h(x,y,z,t),$$

where t represents time and x, y, z represent the spatial coordinates at point (x,y,z). The function h then describes the pressure over time of the reflection signal for a reflector at point (x,y,z), e.g., a signal reflected from a tissue or piece of material. The function h may be stored in a matrix representation, where each column index represents a point in space r=(x,y,z) and each row index represents a time point. If the distribution of the reflector in the volume is then described by b(x,y z) ($\mathbb{R}^3 \rightarrow \mathbb{R}$), the resulting signal $\mathcal{S}$ for a combination of reflectors described by b can be obtained by $\mathcal{S}$ =h×b. Thus, if a signal S is detected by a transducer and the acoustic field h of the emitting aperture is known, the distribution of the reflectors can be determined by inverting $\mathcal{S}$ =h×b.

In this way, three-dimensional signal detection is possible in a wide variety of applications. FIG. 8 shows schematically exemplary process steps for a detection method using a frequency-coded acoustic transducer. First, in step 80, a frequency-encoded acoustic field with a known spatial distribution h is generated and impinges on an object of interest, where the sound is at least partially reflected. In step 82, the reflected ultrasonic signal S is detected by an acoustic transducer as previously described and passed as a single signal to a processing unit, for example a suitable processor. There, in step 84, it is reconstructed by suitable algorithms or calculations using the information about the irradiated acoustic field h and thus the spatial distribution of the reflectors b is obtained. Finally, in step 86 this result can be further processed and reproduced, for example, in the form of image data.

Likewise, transducers according to exemplary embodiments can be used for applications in which no imaging is required, but an application-specific acoustic field pattern is to be generated, for example a defined focus position or also more complex acoustic fields. This applies, for example, to ultrasound therapy in which a focus is to be positioned at a specific location in the tissue. Thus, specific ultrasonic fields can be formed, for example, for manufacturing processes, such as ultrasound-induced phase transfer for local consolidation of materials.

For this purpose, various analytical calculations, numerical approaches, simulations and similar methods can be used to calculate the necessary manufacturing parameters for a given embodiment in order to form a desired acoustic field F from it. FIG. 9 shows exemplary steps of a method for designing an acoustic transducer. The type of frequency coding is application-specific. In step 90, a desired acoustic field distribution (F(x,y,z), F: $\mathbb{R}^3 \rightarrow \mathbb{R}$) is defined or selected, and then in step 92 a set of spatially distributed partial acoustic fields is searched for or calculated by suitable methods, which results in the desired acoustic field distribution F when all partial acoustic fields are superimposed. Then, in a next step 94, suitable sub-apertures can be selected which are capable of generating the required partial acoustic fields. The design of the sub-apertures is thus also dependent on the choice of embodiment. Alternatively, the simulation or calculation can directly optimize the suitable sub-apertures until the superimposed acoustic field corresponds to the desired spatial structuring, for example starting from a symmetrical or homogeneously distributed initial configuration or from identical sub-apertures, which are then modified according to the desired focal position and spatial structure of the acoustic field. As indicated in the figure, steps 92 and 94 may optionally be repeated or run multiple times, for example in order to further optimize a design in multiple steps. Finally, the parameters found can be further processed in step 96, transferred to a processing unit, stored or used in other ways.

In certain cases, randomized frequency coding and thus randomized formation and arrangement of sub-apertures may also be selected. For example, when using imaging based on compressed sensing, such randomized or pseudo-randomized frequency coding is possible.

Optionally, manufacturing parameters such as material costs or boundary conditions such as maximum dimensions of an aperture can also be included in corresponding simulation procedures in order to find the optimum distribution and design of the sub-apertures for a desired total acoustic field, taking such aspects into account.

An exemplary method for manufacturing such spatially frequency-coded transducers may be implemented, for example, in the form of suitable software and/or hardware in which a corresponding simulation or calculation method is implemented. The results may then be directly incorporated, for example, into a manufacturing method for an ultrasonic transducer. Depending on the manufacturing method, the parameters found by calculation or simulation may be directly forwarded to a machining center or other manufacturing system and implemented there. Alternatively, the results can be stored, displayed and/or transmitted in a suitable manner.

In general, the described transducers with frequency-coded acoustic fields can be used in a wide variety of technical fields. These include, for example, sensors for volumetric distance, level and flow measurements, such as in the automotive sector; ultrasound for medical diagnostics and therapy, e.g., also focused ultrasound for medical therapy or stimulation (high intensity focused ultrasound, HIFU); three-dimensional imaging in medical and non-medical applications; non-destructive material testing, e.g., in manufacturing processes and for testing purposes; three-dimensional condition monitoring of systems; surface detection in a wide variety of fields, e.g., air, water, tissue, solids; sonar systems; ultrasound-assisted material processing and three-dimensional material structuring; 3D printing processes; three-dimensional manipulation of e.g., particles or cells; distance measurements, such as sensors in bumpers of motor vehicles, and many more. In many of these applications, the described sensors or transducers can ensure that a much smaller number of sensors are required, for example only a single sensor in a bumper instead of three to five of the usual sensors, while at the same time enabling three-dimensional measurement without extended signal overhead. The small amount of data due to the single-channel transmission offers great advantages for transmissions via radio interfaces and in other areas. Overall, both the small size and the significant reduction in electronic contacts and signal channels ensure a substantial reduction in costs.

Depending on the area, the acoustic transducers may be used only for generating ultrasound, only for detecting ultrasound, or may be used combined for generating and detecting ultrasound fields, as is required for imaging, for example. Optionally, several acoustic transducers may be used, e.g., a combined element comprising two transducer elements, one of which is provided for receiving and one of which is provided for generating an acoustic field.

In general, the transducers according to the invention are particularly well suited for use in digitized industrial applications (so-called Industry 4.0), for example, due to the savings in installation space and costs due to the control by only one electronic control/reception channel for the entire aperture and the high possible degree of integration (e.g., in integrated production with other components on a wafer or a printed circuit board). The reconstruction of an acoustic field detected by such a transducer is possible with comparatively low computational effort, while the complexity of the electrical or electronic elements is significantly reduced.

We claim:

1. An acoustic transducer for generating and/or receiving a spatially structured acoustic field, comprising:

- a total aperture which generates and/or received said acoustic field,
- wherein said total aperture comprises a plurality of sub-apertures,
- wherein each of said sub-apertures is arranged to receive and/or generate ultrasound having a specific frequency spectrum,
- wherein the specific frequency spectra of at least two of said sub-apertures differ from each other,
- wherein all sub-apertures of said total aperture are connected to a same electronic drive channel, and
- wherein said total aperture is formed by a piezoelectric element, and wherein the sub-apertures are formed by regions of the piezoelectric element having different thickness.

2. The acoustic transducer of claim 1, wherein said plurality of sub-apertures are distributed substantially in a plane perpendicular to a direction of propagation of the acoustic field.

3. The acoustic transducer of claim 1, wherein the plurality of sub-apertures have, at least in part, different diameters.

4. The acoustic transducer according to claim 1, wherein said electrical drive channel is arranged to output an alternating signal having a predetermined frequency spectrum to said sub-apertures, said alternating signal exciting at least one movable element of each sub-aperture to vibrate.

5. A transducer device comprising a plurality of periodically arranged acoustic transducers according to claim 1, each transducer having and being connected to a separate electronic drive channel.

6. A method of manufacturing an acoustic transducer for generating and/or receiving a spatially structured acoustic field, wherein the acoustic transducer comprises:

a total aperture which generates and/or receives said acoustic field, wherein said total aperture comprises a plurality of sub-apertures, wherein each of said sub-apertures is arranged to receive and/or generate ultrasound having a specific frequency spectrum, wherein the specific frequency spectra of at least two of said sub-apertures differ from each other, and wherein all sub-apertures of said total aperture are connected to a same electronic drive channel, wherein said method comprises:

determining a desired spatial acoustic field distribution of a total aperture;

obtaining, from the desired acoustic field distribution, parameters of a plurality of sub-apertures that form the total aperture, wherein obtaining said parameters comprises at least one of: an analytical calculation of the parameters, a numerical calculation of the parameters, and a simulation method for the parameters.

7. The method of claim 6, wherein obtaining the parameters of said sub-apertures comprises: calculating partial acoustic field distributions each having a specific frequency spectrum such that a superposition of all partial acoustic field distributions results in the desired spatial acoustic field distribution, and obtaining parameters of the sub-apertures such that each sub-aperture is designed to produce one of the partial acoustic field distributions.

8. The method of claim 6, wherein said parameters of a sub-aperture comprise at least one of the following:

dimensions of a sub-aperture, a geometric shape of a sub-aperture, a thickness of a movable element of a sub-aperture, and a relative arrangement of a sub-aperture within the total aperture.

9. A method of decoding a spatially structured acoustic field comprising:

detecting an ultrasonic signal comprising reflected signals of an irradiated acoustic field, the irradiated acoustic field having a predetermined spatial structure, and calculating, on the basis of said detected signal and said predetermined spatial structure of the irradiated acoustic field, a spatial distribution of reflecting elements which generate the reflected signals, wherein said ultrasonic signal is detected using a transducer comprising:

a total aperture which generates and/or received said acoustic field, wherein said total aperture comprises a plurality of sub-apertures, wherein each of said sub-apertures is arranged to receive and/or generate ultrasound having a specific frequency spectrum, wherein the specific frequency spectra of at least two of said sub-apertures differ from each other, wherein all sub-apertures of said total aperture are connected to a same electronic drive channel, and wherein said ultrasonic signal is present as an output signal of the one electrical drive channel of the transducer.

10. The method of claim 9, further comprising:

displaying a two-dimensional or three-dimensional image from said calculated spatial distribution of reflecting elements.

* * * * *